(12) United States Patent
Katayama et al.

(10) Patent No.: US 8,994,364 B2
(45) Date of Patent: Mar. 31, 2015

(54) POWER SUPPLY CONTROLLING APPARATUS, AND NON-TRANSITORY COMPUTER READABLE RECORDING MEDIUM

(75) Inventors: Shinichi Katayama, Shinagawa (JP); Naoyuki Nagao, Shinagawa (JP)

(73) Assignee: Fujitsu Component Limited, Tokyo (JP)

( * ) Notice: Subject to any disclaimer, the term of this patent is extended or adjusted under 35 U.S.C. 154(b) by 473 days.

(21) Appl. No.: 12/929,428

(22) Filed: Jan. 24, 2011

(65) Prior Publication Data
US 2011/0181270 A1 Jul. 28, 2011

(30) Foreign Application Priority Data
Jan. 26, 2010 (JP) ................................ 2010-014794

(51) Int. Cl.
| | | |
|---|---|---|
| G01R 13/04 | (2006.01) | |
| G01R 21/00 | (2006.01) | |
| G06F 1/26 | (2006.01) | |
| G01R 13/00 | (2006.01) | |
| G01R 22/00 | (2006.01) | |
| G01R 22/10 | (2006.01) | |
| G01R 22/06 | (2006.01) | |
| G01R 21/133 | (2006.01) | |

(52) U.S. Cl.
CPC ............... *G06F 1/266* (2013.01); *G01R 13/00* (2013.01); *G01R 22/00* (2013.01); *G01R 22/10* (2013.01); *G01R 13/04* (2013.01); *G01R 22/06* (2013.01); *G01R 21/133* (2013.01)
USPC ........................................... 324/113; 702/61

(58) Field of Classification Search
CPC ...... G01R 13/00; G01R 13/04; G01R 21/133; G01R 22/10; G01R 22/06; G01R 22/00
USPC .............................................. 324/113; 702/61
See application file for complete search history.

(56) References Cited

U.S. PATENT DOCUMENTS 7,793,061 B1 * 9/2010 Gupta et al. ................... 711/162
8,378,844 B2 * 2/2013 Junker et al. .............. 340/870.02
(Continued)

FOREIGN PATENT DOCUMENTS

| | | |
|---|---|---|
| JP | 2005401476 | 10/2005 |
| JP | 2008-167544 | 7/2008 |

OTHER PUBLICATIONS

Antonio Romero of Oracle, Oracle Database "Backup and Recovery Basics", 2003, Part No. B10735-01, Version 10.1.*

*Primary Examiner* — Patrick Assouad
*Assistant Examiner* — Hoang X Nguyen
(74) *Attorney, Agent, or Firm* — Staas & Halsey LLP (57) ABSTRACT

A power supply controlling apparatus including: a measurement portion that measures electric power information concerning electric power supplied to another apparatus, a storing control portion that stores the electric power information measured by the measurement portion and measurement time when the electric power information is measured, into a volatile storage, and stores the electric power information and the measurement time stored into the volatile storage, into a nonvolatile storage in desired timing; and a supplement portion that, when a first power supply is turned off and turned on again, supplements to the volatile storage electric power information and time concerning electric power assumed to be supplied to the another apparatus between final measurement time in a plurality of pieces of measurement time stored in the nonvolatile storage and time when the first power supply is turned on again.

10 Claims, 9 Drawing Sheets

(56) References Cited

U.S. PATENT DOCUMENTS

2005/0172166 A1* 8/2005 Eguchi et al. .................. 714/20
2005/0240814 A1 10/2005 Sasakura et al.
2007/0220227 A1* 9/2007 Long ............................. 711/165
2008/0195794 A1* 8/2008 Banker ......................... 711/100
2009/0287433 A1* 11/2009 Houston et al. ................ 702/62

* cited by examiner

| N TIME | MEASURE-MENT TIME | CURRENT VALUE | VOLTAGE VALUE |
|---|---|---|---|
| N-1 TIME | MEASURE-MENT TIME | CURRENT VALUE | VOLTAGE VALUE |
| ⋮ | ⋮ | ⋮ | ⋮ |
| THIRD TIME | MEASURE-MENT TIME | CURRENT VALUE | VOLTAGE VALUE |
| SECOND TIME | MEASURE-MENT TIME | CURRENT VALUE | VOLTAGE VALUE |
| FIRST TIME | MEASURE-MENT TIME | CURRENT VALUE | VOLTAGE VALUE |

POWER SUPPLY CONTROLLING APPARATUS, AND NON-TRANSITORY COMPUTER READABLE RECORDING MEDIUM

CROSS-REFERENCE TO RELATED APPLICATION

This application is based upon and claims the benefit of priority of the prior Japanese Patent Application No. 2010-014794, filed on Jan. 26, 2010, the entire contents of which are incorporated herein by reference.

FIELD

A certain aspect of the embodiments discussed herein is related to a power supply controlling apparatus and a non-transitory computer readable medium.

BACKGROUND

Conventionally, there has been known a power supply controlling apparatus that stores electric power information (e.g. a current value and a voltage value) concerning electric power supplied to another apparatus as a history into a nonvolatile storage.

For example, a document 1 (Japanese Laid-Open Patent Application No. 2008-167544) discloses an electric power controlling system that reads out from a nonvolatile memory power consumption that increases after a printer starts, and controls the start-up of the printer by comparing the power consumption with usable electric energy.

For example, a document 2 (Japanese Laid-Open Patent Application No. 2005-301476) discloses a feeding control system that stores a history of voltage data in a volatile memory. When the power dispatching control system detects an interrupt signal, the power dispatching control system transfers the voltage data stored in the volatile memory to a nonvolatile storage, and analyzes a reason of abnormality.

Incidentally, there is a power supply controlling apparatus that separately includes a power supply of the power supply controlling apparatus and a power supply supplying electric power to another apparatus, and does not stop supplying the electric power to the another apparatus even when the power supply of the power supply controlling apparatus is turned off. Also, as a method of leaving the history of electric power information concerning the electric power supplied to another device into the nonvolatile storage, there is a method of writing the electric power information in a volatile storage at constant intervals, and then writing the electric power information written in the volatile storage in the nonvolatile storage in desired timing.

However, in the above-mentioned construction, when the power supply of the power supply controlling apparatus is turned off after the electric power information is written in the nonvolatile storage, and then the power supply of the power supply controlling apparatus is turned on again, electric power information from time when the electric power information is written in the nonvolatile storage to time when the power supply of the power supply controlling apparatus is turned on again is not stored into the nonvolatile storage, and hence the electric power information of the time period is lost.

SUMMARY

According to an aspect of the present invention, there is provided a power supply controlling apparatus including: a first power supply that supplies electric power to another apparatus; a second power supply that supplies electric power to the another apparatus even when the first power supply is turned off; a measurement portion that measures electric power information concerning electric power supplied to the another apparatus; a storing control portion that stores the electric power information measured by the measurement portion and measurement time when the electric power information is measured, into a volatile storage, and stores the electric power information and the measurement time stored into the volatile storage, into a nonvolatile storage in desired timing; and a supplement portion that, when the first power supply is turned off and turned on again, supplements to the volatile storage electric power information and time concerning electric power assumed to be supplied to the another apparatus between final measurement time in a plurality of pieces of measurement time stored in the nonvolatile storage and time when the first power supply is turned on again.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

A description will now be given, with reference to the accompanying drawings, of an embodiment of the present invention.

Figure 1:
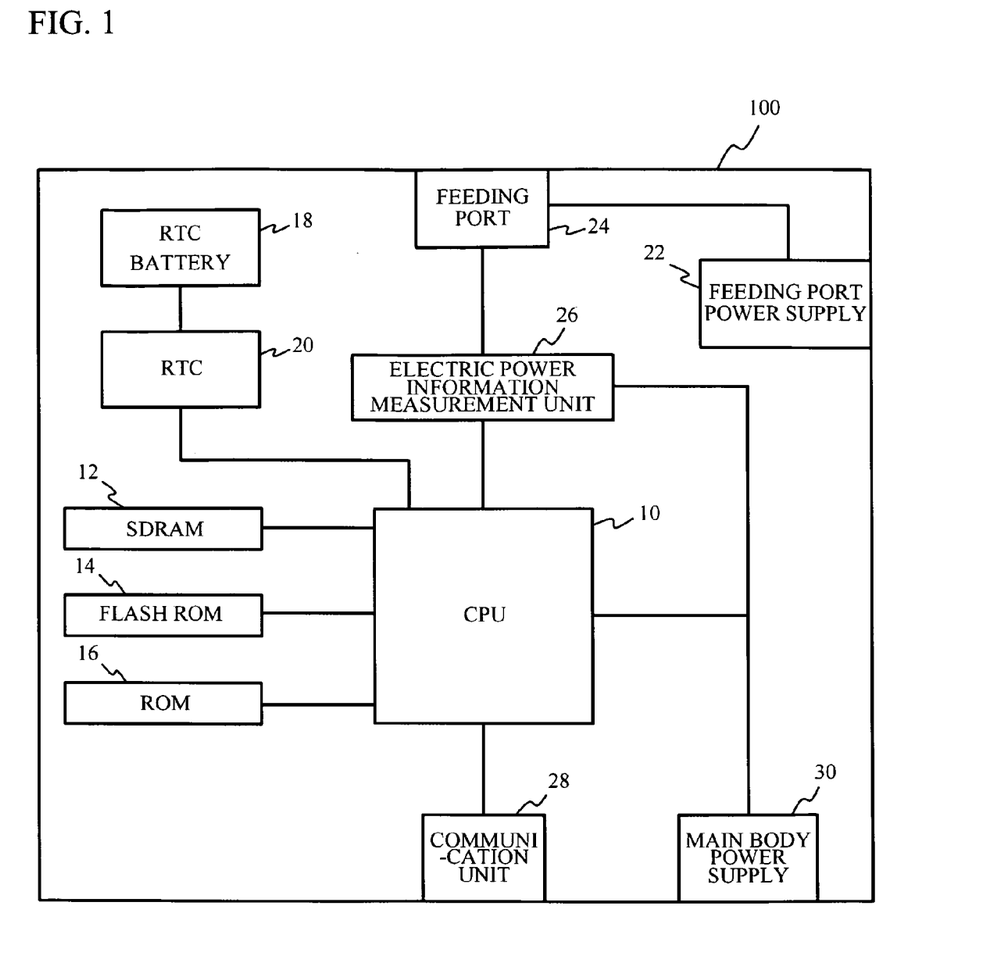
FIG. 1 is a block diagram illustrating an example of a power supply controlling apparatus according to a first embodiment.

FIG. 1 is a block diagram illustrating an example of a power supply controlling apparatus according to a first embodiment. As illustrated in FIG. 1, a power supply controlling apparatus 100 includes: a CPU (Central Processing Unit) 10, a SDRAM (Synchronous Dynamic Random Access Memory) 12 as a volatile storage; a flash ROM (Flash Read Only Memory) 14 as a nonvolatile storage; a ROM (Read Only Memory) 16; a RTC (Real Time Clock) 20 that is a timer module equipped with a RTC (Real Time Clock) battery 18; a feeding port 24 that feeds electric power injected from a feeding port power supply 22 to another apparatus; an electric power information measurement unit 26 that measures a current value and a voltage value (Hereafter, the current value and the voltage value are called electric power information) which flow to the feeding port 24 at constant intervals; a communication unit 28 as a communication I/F; and a main body power supply 30 that supplies electric power to the CPU 10, the electric power information measurement unit 26, and so on. The CPU 10 is connected to the SDRAM 12, the flash ROM 14, the ROM 16, the RTC 20, the electric power information measurement unit 26 and the communication unit 28 via a bus.

The main body power supply 30 supplying the electric power to the CPU 10 and the feeding port power supply 22 supplying the electric power to the feeding port 24 are separately provided. That is, the main body power supply 30 that is a power supply of the power supply controlling apparatus 100, and the feeding port power supply 22 that is a power supply for supplying the electric power to another apparatus are separately provided. Thereby, the feeding port power supply 22 stays on, even when the main body power supply 30 is turned of supplying the electric power to another device is continued without stopping.

The CPU 10 controls the whole power supply controlling apparatus 100. The ROM 16 stores a control program executed by the CPU 10. The SDRAM 12 stores the electric power information measured by the electric power information measurement unit 26 at constant intervals, and measurement time when the electric power information is measured. The flash ROM 14 stores the electric power information and the measurement time regularly transmitted from the SDRAM 12.

Figure 2:
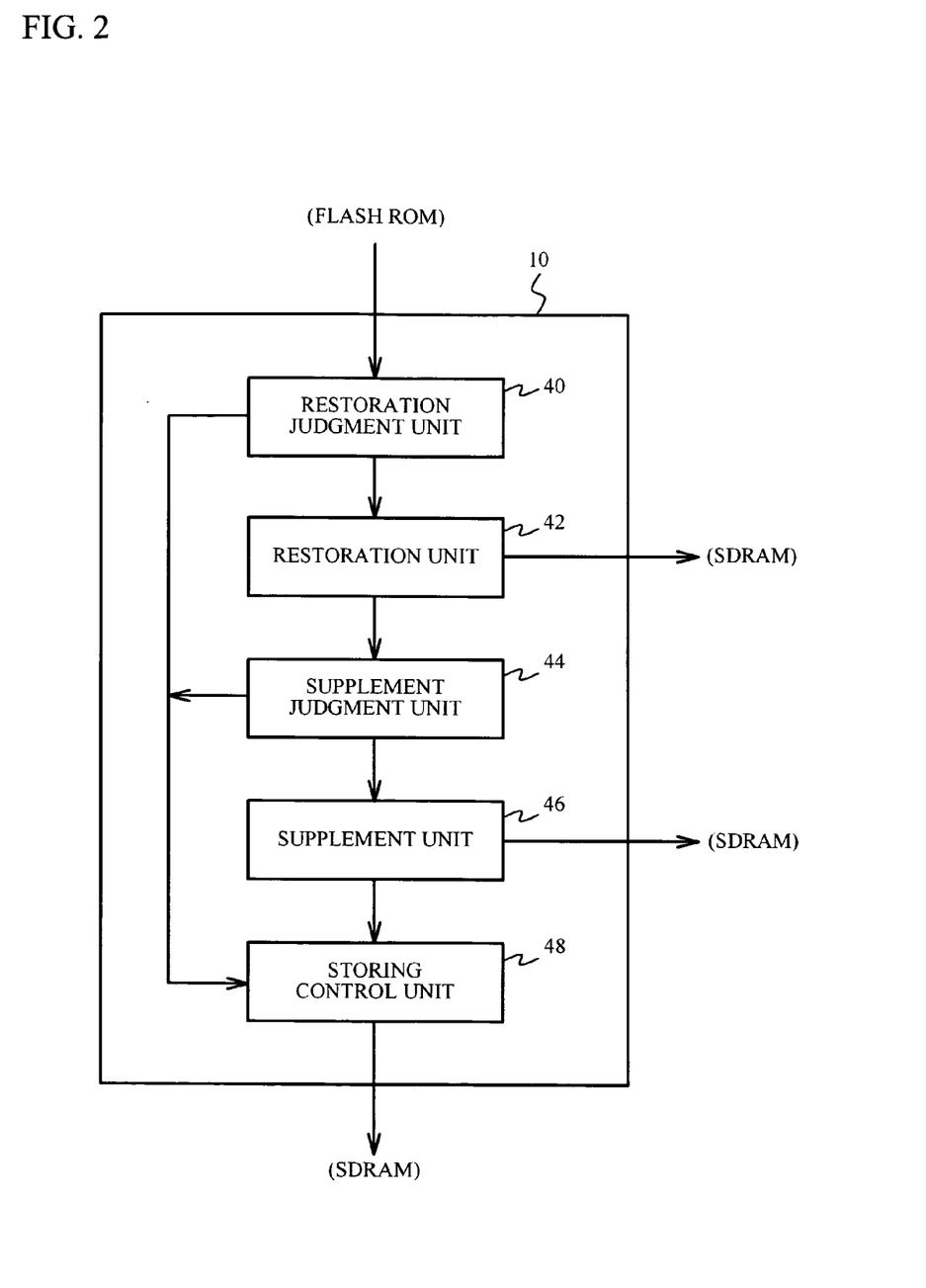
FIG. 2 is a functional block diagram of a CPU included in the power supply controlling apparatus.

FIG. 2 is a functional block diagram of the CPU 10 included in the power supply controlling apparatus 100. The CPU 10 functions as a restoration judgment unit 40, a restoration unit 42, a supplement judgment unit 44, a supplement unit 46, a storing control unit 48, as illustrated in FIG. 2, by executing the control program stored into the ROM 16.

The restoration judgment unit 40 judges whether restorable electric power information and restorable measurement time exist in the flash ROM 14 after the main body power supply 30 is turned on. When it is judged by the restoration judgment unit 40 that the electric power information and the measurement time are restorable, the restoration unit 42 restores the electric power information and the measurement time by transmitting the electric power information and the measurement time stored into the flash ROM 14 to the SDRAM 12 to store them. The supplement judgment unit 44 judges whether the electric power information and the measurement time can be supplemented by comparing time when the main body power supply 30 is turned on with measurement time when the electric power information is finally measured, in a plurality of pieces of measurement time stored in the flash ROM 14.

When it is judged by the supplement judgment unit 44 that the electric power information and the measurement time can be supplemented, the supplement unit 46 supplements to the SDRAM 12 electric power information and time concerning the electric power assumed to be supplied to another apparatus from the feeding port 24 between the measurement time when the electric power information is finally measured, in a plurality of pieces of measurement time stored in the flash ROM 14, and the time when the main body power supply 30 is turned on. The storing control unit 48 stores the electric power information measured by the electric power information measurement unit 26 at constant intervals, and the measurement time acquired from the RTC 20 when the electric power information is measured, into the SDRAM 12. The storing control unit 48 regularly transmits the electric power information and the measurement time stored into the SDRAM 12 to the flash ROM 14 to store them.

Figure 3A:
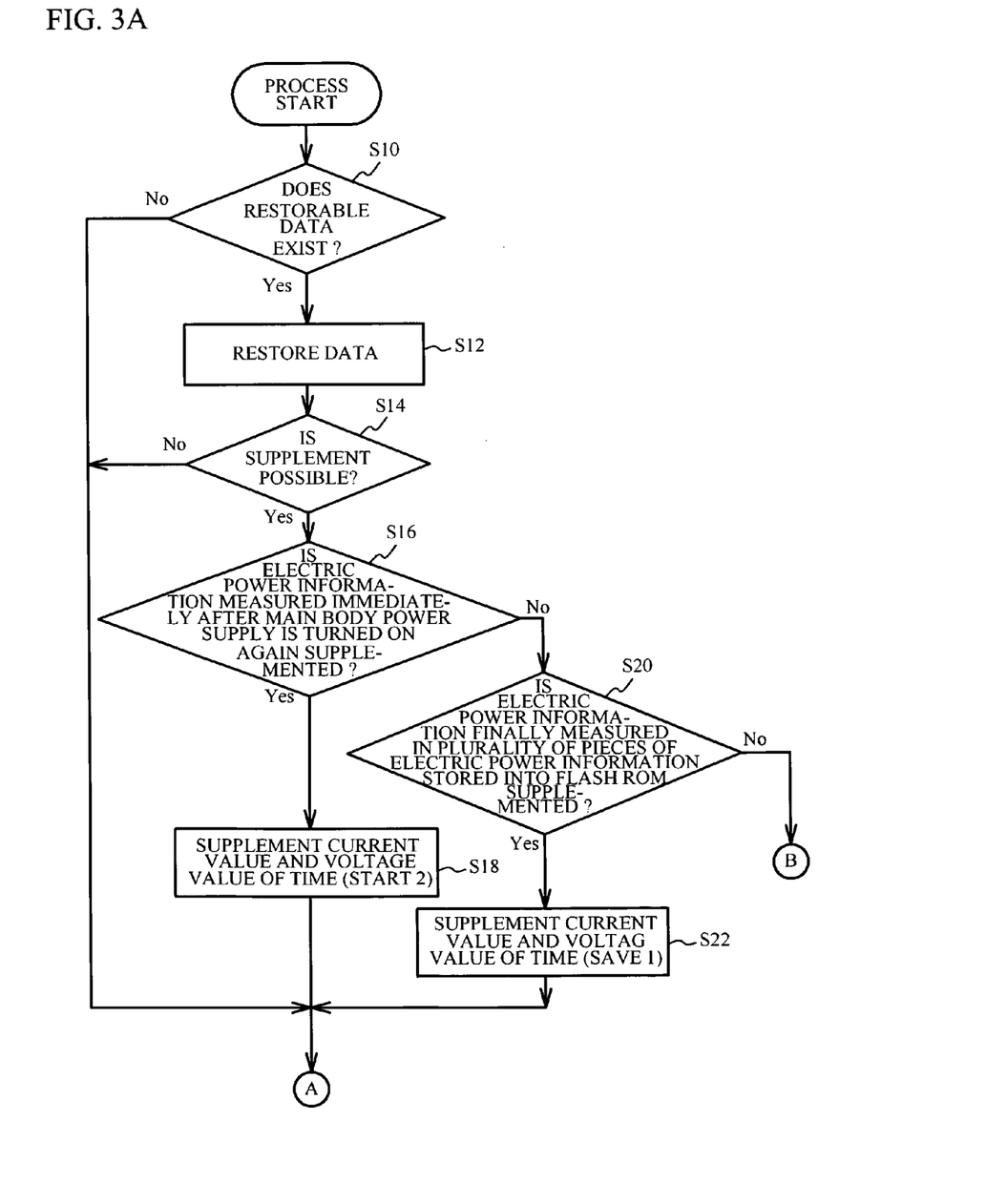
FIGS. 3A and 3B are flowcharts explaining an example of a process executed with the CPU included in the power supply controlling apparatus.
Figure 3B:
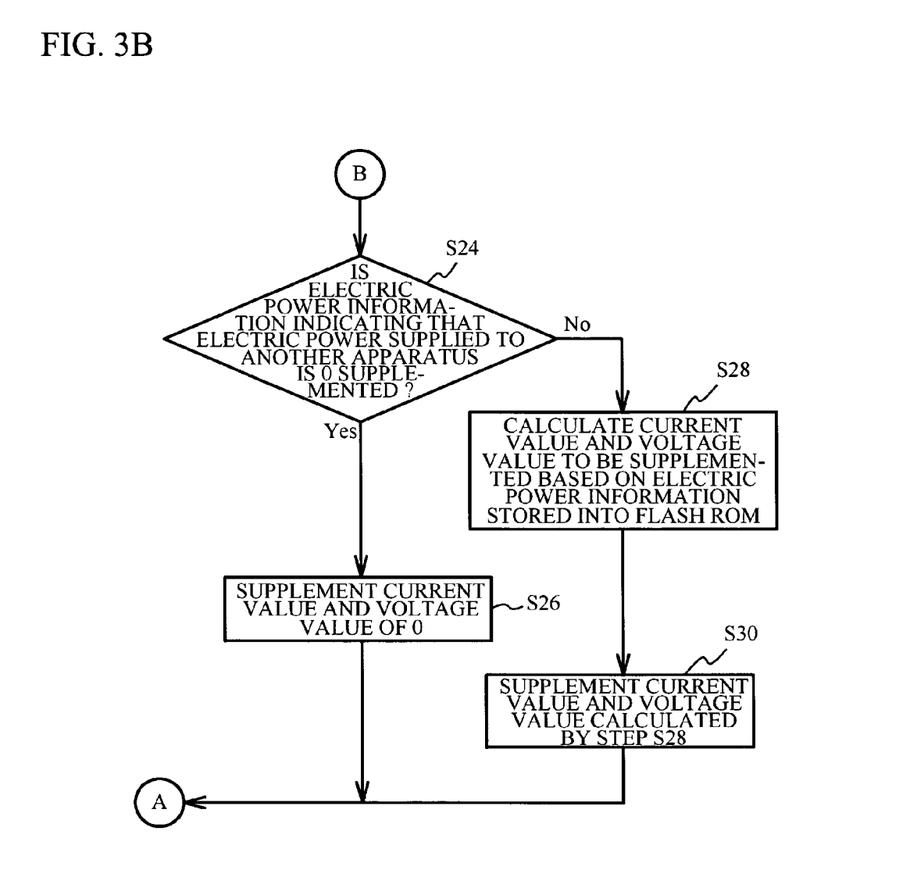
Figure 4:
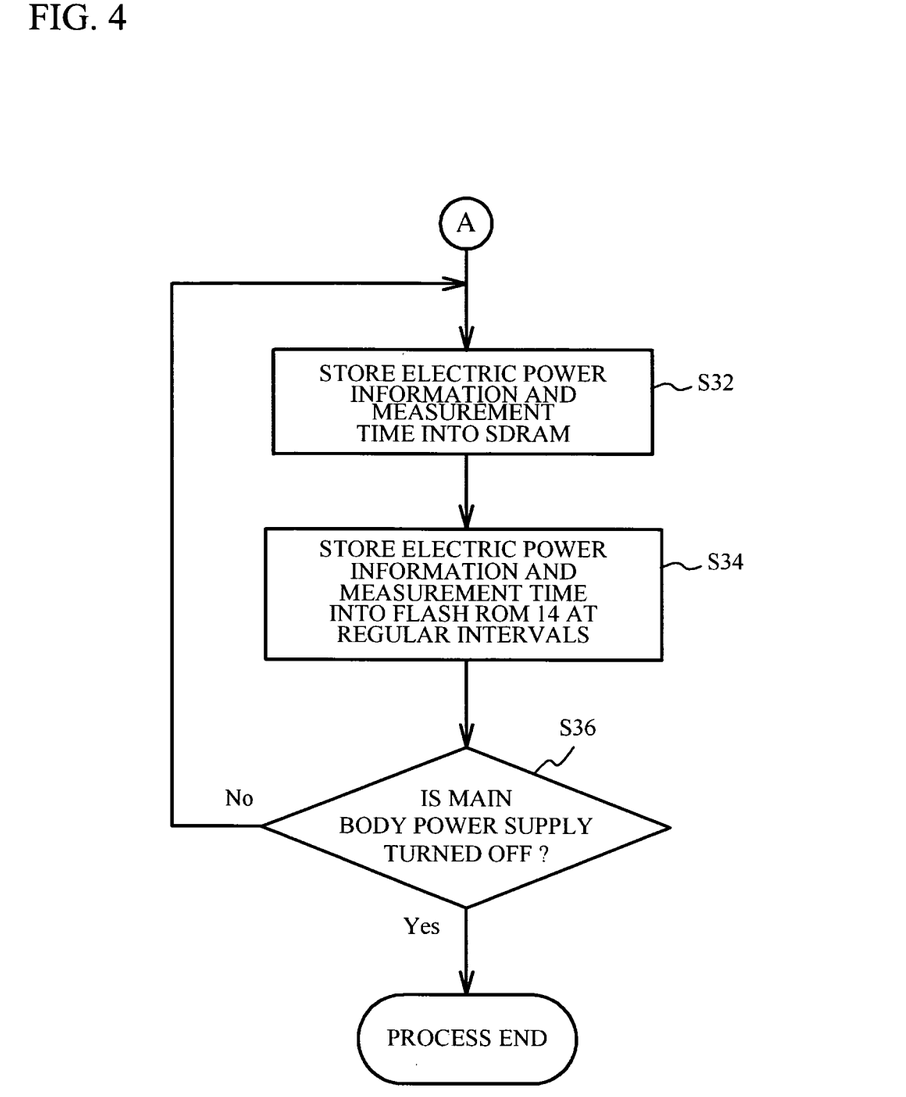
FIG. 4 is a flowchart explaining an example of a process executed with the CPU included in the power supply controlling apparatus.

FIGS. 3A, 3B and 4 are flowcharts explaining an example of a process executed with the CPU 10 included in the power supply controlling apparatus 100. When the main body power supply 30 is turned on, the CPU 10 judges whether restorable data on the electric power information and the measurement time exists in the flash ROM 14 as illustrated in FIG. 3A (step S10). When it is judged in step S10 that the restorable data does not exist (NO), the procedure proceeds to step S32 in FIG. 4. For example, when the data on the electric power information and the measurement time is not stored into the flash ROM 14, such as the case where the main body power supply 30 is first turned on and the power supply controlling apparatus 100 is used, the CPU 10 judges that the restorable data does not exist, and the procedure proceeds to step S32.

Figure 5:
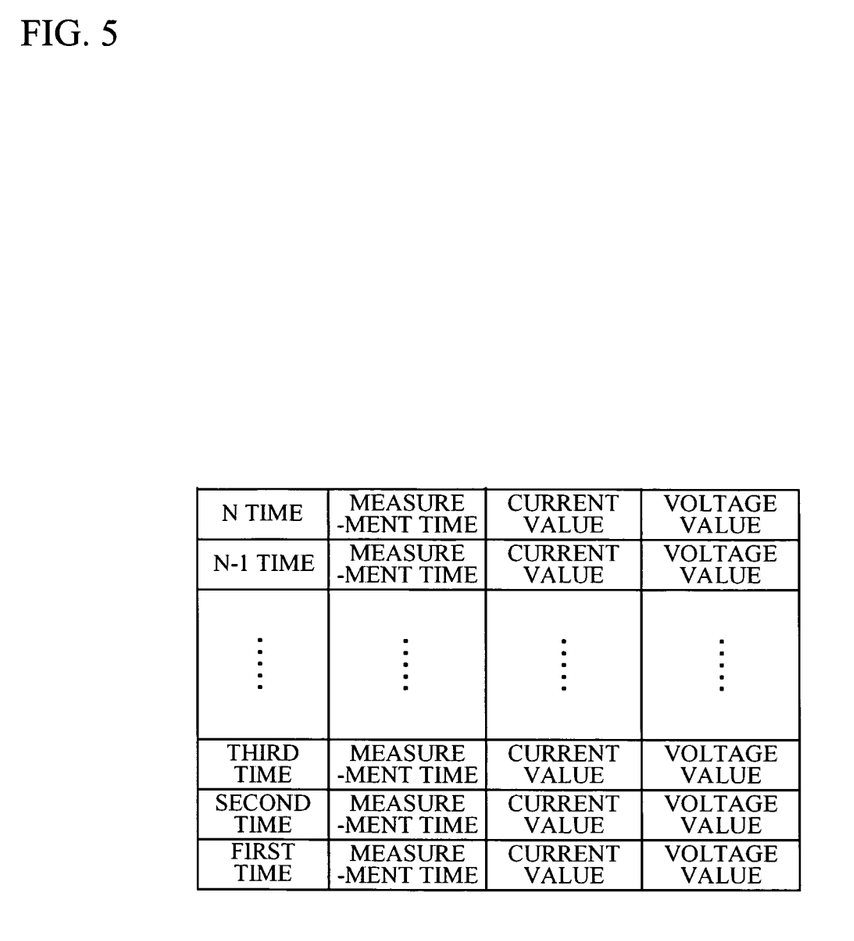
FIG. 5 is a schematic diagram illustrating an example of data stored in a SDRAM.

The CPU 10 stores the electric power information measured by the electric power information measurement unit 26 at constant intervals (e.g. time intervals of 1 second, 5 seconds, or the like), and the measurement time acquired from the RTC 20 when the electric power information is measured, into the SDRAM 12 (step S32). Here, FIG. 5 illustrates an example of data stored in the SDRAM 12 when the electric power information is measured n-times by the electric power information measurement unit 26. As illustrated in FIG. 5, a plurality of pieces of electric power information (i.e., current values and voltage values) corresponding to n-times measured by the electric power information measurement unit 26, and measurement times when the plurality of pieces of electric power information are measured are stored into the SDRAM 12.

Figure 6A:
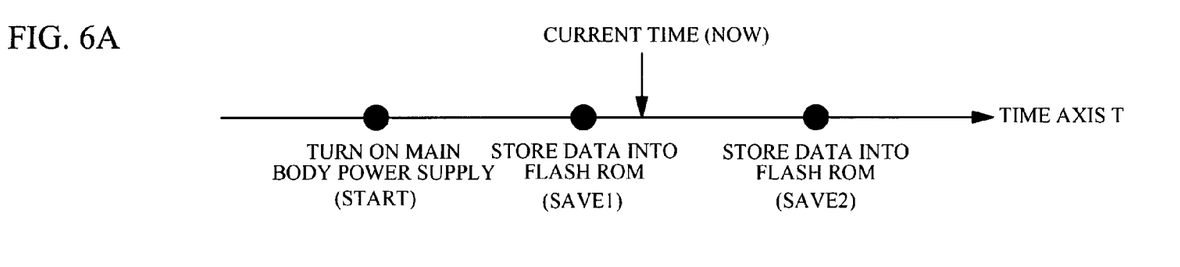
FIG. 6A is a schematic diagram illustrating an example of current time when a horizontal axis is set to a time axis.
Figure 6B:
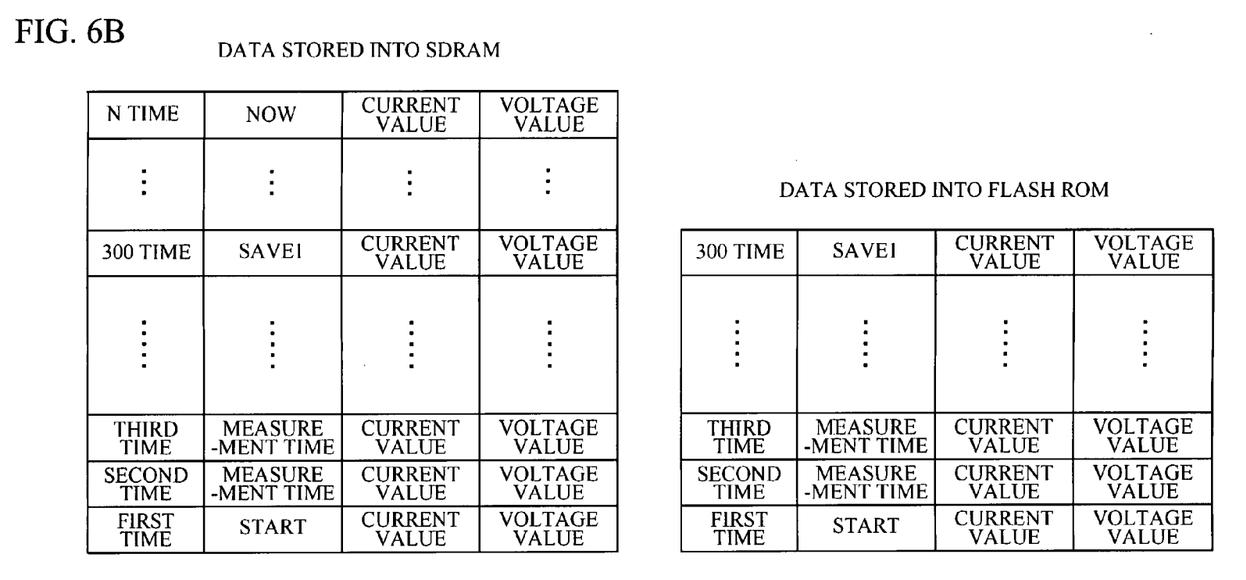
FIG. 6B is a schematic diagram illustrating an example of data stored in the SDRAM and a flash ROM in the current time.

Referring again to FIG. 4, the CPU 10 transmits the plurality of pieces of electric power information and the measurement times stored in the SDRAM 12 to the flash ROM 14 to store them at regular intervals (e.g. at timing when the electric power information is measured 300 times by the electric power information measurement unit 26) (step S34). Here, a description will now be given, with reference to FIGS. 6A and 6B, of data stored into the SDRAM 12 and the flash ROM 14. FIG. 6A is a schematic diagram illustrating an example of current time (NOW) when a horizontal axis is set to a time axis T. FIG. 6B is a schematic diagram illustrating an example of data stored in the SDRAM 12 and the flash ROM 14 in the current time (NOW).

It is assumed that, for example, as illustrated in FIG. 6A, the current time (NOW) is set to timing after the main body power supply 30 has been first turned on (START), the 300 times measurement of the electric power information by the electric power information measurement unit 26 has been completed, and the plurality of pieces of electric power information and the measurement times have been stored into the flash ROM 14 (SAVE 1), and the current time (NOW) is further set to timing before next electric power information and next measurement time are stored into the flash ROM 14 (SAVE 2). In such current time (NOW), the data stored into the SDRAM 12 is the plurality of pieces of electric power information and the measurement times measured between the time (START) when the main body power supply 30 is turned on and the current time (NOW), as illustrated in FIG.

6B. That is to say, data concerning the electric power supplied from the feeding port 24 to another apparatus between the time (START) when the main body power supply 30 is turned on and the current time (NOW) is stored in the SDRAM 12. On the other hand, the plurality of pieces of electric power information and the measurement times corresponding to 300 times between the time (START) when the main body power supply 30 is turned on and the time (SAVE 1) when the 300 times measurement of the electric power information is completed are stored into the flash ROM 14. That is to say, data concerning the electric power supplied to another apparatus between the time (START) and the time (SAVE 1) is stored in the flash ROM 14.

Referring again to FIG. 4, the CPU 10 repeatedly executes the operation of steps S32 and S34 until the main body power supply 30 is turned off (i.e., until the judgment to step S36 is YES).

Figure 7:
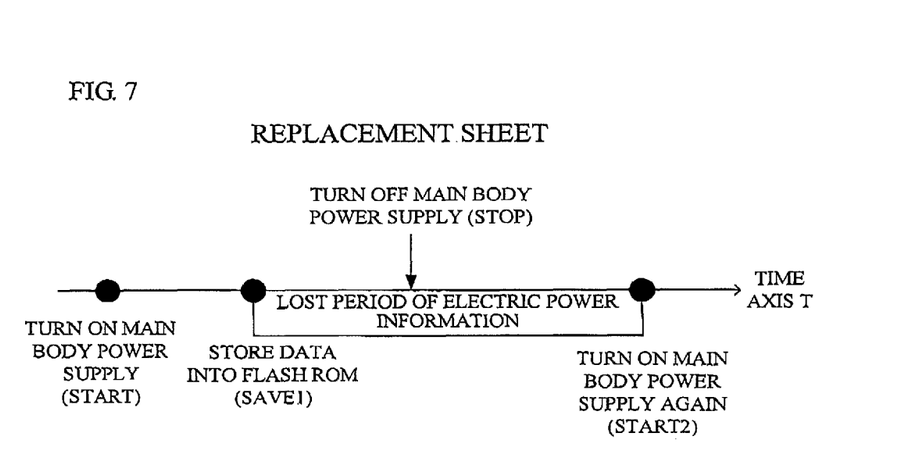
FIG. 7 is a schematic diagram illustrating an example of electric power information lost when a power supply of the power supply controlling apparatus is turned off after storing data into the flash ROM is completed, and then the power supply of the power supply controlling apparatus is turned on again.

Here, it is assumed that the main body power supply 30 is turned off at time (STOP) before next electric power information and next measurement time are stored into the flash ROM 14, and the main body power supply 30 is turned on again at time (START 2), as illustrated in FIG. 7. In this case, as described above, the main body power supply 30 and the feeding port power supply 22 are separately provided, and hence the supply of the electric power to another apparatus is continued even when the main body power supply 30 is turned off. However, when the main body power supply 30 is turned off, the electric power information is not measured by the electric power information measurement unit 26, and the plurality of pieces of electric power information and the measurement times stored into the SDRAM 12 are lost. As a result, only data on the plurality of pieces of electric power information and the measurement times stored into the flash ROM 14 remains. That is, the data on the plurality of pieces of electric power information and the measurement times concerning the electric power supplied from the feeding port 24 to another apparatus between the time (SAVE 1) when the plurality of pieces of electric power information and the measurement times are stored into the flash ROM 14 and the time (START 2) when the main body power supply 30 is turned on again is lost as illustrated in FIG. 7.

Referring again to FIG. 3A, after the main body power supply 30 is turned on, the CPU 10 of the power supply controlling apparatus 100 judges whether restorable data on the electric power information and the measurement time exists in the flash ROM 14 (step S10). For example, when the plurality of pieces of electric power information and the measurement times are stored into the flash ROM 14 as illustrated in FIG. 6B, the CPU 10 judges that the restorable data exists (YES in step S10), and restores the plurality of pieces of electric power information and the measurement times by transmitting the plurality of pieces of electric power information and the measurement times stored into the flash ROM 14 to the SDRAM 12 to store them (step S12).

Next, the CPU 10 judges whether to be able to supplement the electric power information and the measurement time (step S14). A description will now be given, with reference to FIGS. 6A, 6B and 7, of a concrete example. The CPU 10 compares the time (START 2) when the main body power supply 30 is turned on again with the final measurement time (SAVE 1) in the plurality of pieces of measurement time stored into the flash ROM 14. When a difference between the time (START 2) and the time (SAVE 1) is more than 0 (START 2−SAVE 1>0), the CPU 10 judges that the electric power information and the measurement time can be supplemented (YES in step S14), and supplements the electric power information and the measurement time to the SDRAM 12. That is, the CPU 10 compares the time when the main body power supply 30 is turned on again with the final measurement time in the plurality of pieces of measurement time stored into the flash ROM 14, judges that the electric power information and the measurement time can be supplemented when the time when the main body power supply 30 is turned on again is later than the final measurement time in the plurality of pieces of measurement time stored into the flash ROM 14, and supplements the electric power information and the measurement time to the SDRAM 12.

Figure 8:
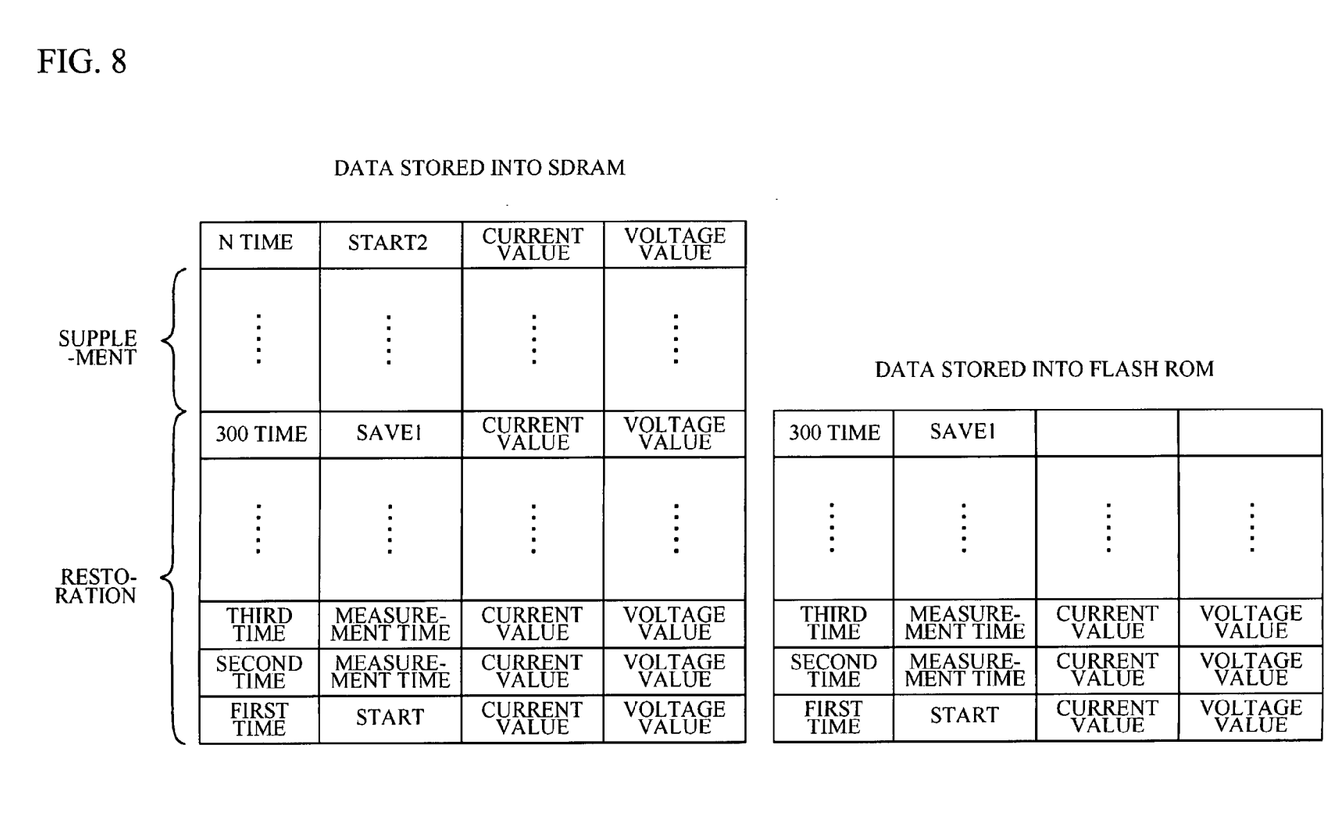
FIG. 8 is a schematic diagram illustrating an example of data stored into the SDRAM when restoration and supplement are completed, and an example of data stored into the flash ROM when the power supply of the power supply controlling apparatus is turned on again.

Here, based on FIGS. 6A, 6B, and 7, FIG. 8 schematically illustrates data stored into the flash ROM 14 when the main body power supply 30 is turned on again, and data stored into the SDRAM 12 when restoration and supplement are completed. As illustrated in FIG. 8, actual measurement data on the plurality of pieces of electric power information and the measurement times between the time (START) when the main body power supply 30 is first turned on and the time (SAVE 1) when data is stored into the flash ROM 14 is stored into the flash ROM 14. The plurality of pieces of electric power information and the measurement times stored into the flash ROM 14 are restored to the SDRAM 12, and hence actual measurement data between the time (START) when the main body power supply 30 is first turned on to the time (SAVE 1) when data is stored into the flash ROM 14 is stored into the SDRAM 12. Further, supplement data on a plurality of pieces of electric power information and times concerning the electric power assumed to be supplied to another apparatus between the time (SAVE 1) when data is stored into the flash ROM 14 and the time (START 2) when the main body power supply 30 is turned on again is stored into the SDRAM 12. It is desirable that the supplement data is supplemented at the same intervals as measurement intervals of the electric power information by the electric power information measurement unit 26. For example, when the electric power information measurement unit 26 measures the electric power information at intervals of one second, it is desirable that the supplement data is supplemented at intervals of one second.

Next, referring again to FIG. 3A, a description will now be given of the electric power information supplemented to the SDRAM 12 in detail. When the CPU 10 judges that the electric power information and the measurement time can be supplemented (YES in step S14), the CPU 10 judges whether to supplement the lost electric power information by electric power information measured immediately after the main body power supply 30 is turned on again (step S16). If the answer to step S16 is "YES", the CPU 10 considers that the current value and the voltage value measured at time (START 2) are supplied to another apparatus between the time (SAVE 1) and the time (START 2), and the CPU 10 supplements the current value and the voltage value to the SDRAM 12 (step S18).

If the answer to step S16 is "NO", the CPU 10 judges whether to supplement the lost electric power information by electric power information finally measured in the plurality of pieces of electric power information stored into the flash ROM 14 (step S20). If the answer to step S20 is "YES", the CPU 10 considers that the current value and the voltage value finally measured in the plurality of pieces of electric power information stored into the flash ROM 14 (i.e., the current value and the voltage value of the time (SAVE 1)) are supplied to another apparatus between the time (SAVE 1) and the time (START 2), and the CPU 10 supplements the current value and the voltage value of the time (SAVE 1) to the SDRAM 12 (step S22).

If the answer to step S20 is "NO", the CPU 10 judges whether to supplement the lost electric power information by electric power information indicating that the electric power supplied to another apparatus is "0" (step S24). If the answer to step S24 is "YES", the CPU 10 considers that the electric power is not supplied to another apparatus between the time (SAVE 1) and the time (START 2), and the CPU 10 supplements the current value and the voltage value of "0" to the SDRAM 12 (step S26).

If the answer to step S24 is "NO", the CPU 10 calculates electric power information to be supplemented based on the plurality of pieces of electric power information stored into the flash ROM 14 (step S28), considers that the current value and the voltage value (i.e., electric power information) calculated by step S28 are supplied to another apparatus between the time (SAVE 1) and the time (START 2), and supplements the calculated current value and the calculated voltage value to the SDRAM 12 (step S30). For example, the CPU 10 calculates respective average values of current values and voltage values stored into the flash ROM 14, and supplements the calculated current value and the calculated voltage value as the average values to the SDRAM 12. That is, the CPU 10 supplements electric power information acquired by averaging the plurality of pieces of electric power information stored into the flash ROM 14, to the SDRAM 12.

After the supplement of the electric power information and the measurement time to the SDRAM 12 is completed, the CPU 10 executes the above-mentioned operation of steps S32 to S36.

As described above, the power supply controlling apparatus 100 of the first embodiment includes the main body power supply 30 and the feeding port power supply 22 separately, and does not stop supplying the electric power to another apparatus even when the main body power supply 30 is turned off. The power supply controlling apparatus 100 measures the electric power information concerning the electric power supplied to another apparatus, stores the measured electric power information and the measurement time thereof into the SDRAM 12, and regularly transmits the electric power information and the measurement time stored into the SDRAM 12 to the flash ROM 14 to store the electric power information and the measurement time into the flash ROM 14. Further, when the main body power supply 30 is turned off and turned on again, the power supply controlling apparatus 100 supplements to the SDRAM 12 electric power information and time concerning the electric power assumed to be supplied to another apparatus between the final measurement time in the plurality of pieces of measurement time stored into the flash ROM 14 and the time when the main body power supply 30 is turned on again. Thereby, when the main body power supply 30 is turned off and turned on again, the electric power information and the time concerning the electric power assumed to be supplied to another apparatus between the time when the electric power information and the measurement time are stored into the flash ROM 14 and the time when the main body power supply 30 is turned on again can be supplemented to the SDRAM 12. Therefore, it is possible to continuously acquire a history of the electric power information concerning the electric power supplied to another apparatus, based on the data stored into the SDRAM 12 and the flash ROM 14.

Moreover, the power supply controlling apparatus 100 of the first embodiment stores the measurement time corresponding to the electric power information in addition to the electric power information into the SDRAM 12 and the flash ROM 14. For example, when only the electric power information is stored into the SDRAM 12 and the flash ROM 14, and the measurement time is not stored into the SDRAM 12 and the flash ROM 14, the power supply controlling apparatus 100 cannot calculate the total amount of electric power supplied to another apparatus because there is no time elements. However, when the electric power information and the corresponding measurement time are stored into the SDRAM 12 and the flash ROM 14 as the power supply controlling apparatus 100, the power supply controlling apparatus 100 can calculate the total amount of electric power supplied to another apparatus.

The first embodiment has illustrated that the electric power information supplemented to the SDRAM 12 is any one of the electric power information measured immediately after the main body power supply 30 is turned on again, and the electric power information finally measured in the plurality of pieces of electric power information stored into the flash ROM 14. Since such electric power information is supplemented to the SDRAM 12, the electric power information similar to actual electric power supplied to another apparatus between the final measurement time stored into the flash ROM 14 and the time when the main body power supply 30 is turned on again can be supplemented to the SDRAM 12.

The first embodiment has further illustrated that the electric power information supplemented to the SDRAM 12 is any one of the electric power information indicating that the electric power supplied to another apparatus is "0", and the electric power information calculated from the plurality of pieces of electric power information stored into the flash ROM 14. The first embodiment has illustrated that the electric power information acquired by averaging the plurality of pieces of electric power information is supplemented, as a case where the electric power information calculated from the plurality of pieces of electric power information stored into the flash ROM 14 is supplemented. However, the case where the electric power information calculated from the plurality of pieces of electric power information stored into the flash ROM 14 is supplemented is not limited to this. For example, when the plurality of pieces of electric power information stored into the flash ROM 14 vary, it can be assumed that the electric power supplied between the final measurement time stored into the flash ROM 14 and the time when the main body power supply 30 is turned on again varies similarly. Therefore, a plurality of pieces of electric power information having the same variation history as a variation history of the plurality of pieces of electric power information stored into the flash ROM 14 may be supplemented to the SDRAM 12. Moreover, although for example, first electric power information stored into the flash ROM 14 is a small electric power value, when certain electric power information in the plurality of pieces of electric power information stored into the flash ROM 14 changes into a large electric power value, it can be assumed that a plurality of pieces of electric power information subsequent to the certain electric power information also change into the large electric power values. In this case, the large electric power values as the plurality of pieces of electric power information may be supplemented to the SDRAM 12. That is, the electric power information calculated from the plurality of pieces of electric power information stored into the flash ROM 14 is not limited to the averaged electric power information, but may be various electric power information. Thus, the electric power information calculated from the plurality of pieces of electric power information stored into the flash ROM 14 is supplemented to the SDRAM 12, so that the electric power information similar to actual electric power supplied to another apparatus between the final measurement time stored into the flash ROM 14 and the time when the main body power supply 30 is turned on again can be supplemented to the SDRAM 12.

It is desirable that measurement intervals of the electric power information by the electric power information measurement unit 26 are the same as supplement intervals of the electric power information and the measurement time by the supplement unit 46. Thereby, it is possible to more circumstantially acquire the history of the electric power information concerning the electric power assumed to be supplied to another apparatus between the final measurement time stored into the flash ROM 14 and the time when the main body power supply 30 is turned on again. When the measurement intervals by the electric power information measurement unit 26 are long, the supplement cannot correspond to the accidental increase of the electric energy. Therefore, it is desirable that the measurement intervals by the electric power information measurement unit 26 are short. Although the first embodiment has illustrated a case where the measurement intervals by the electric power information measurement unit 26 are constant intervals such as intervals of one second or five seconds, the measurement intervals by the electric power information measurement unit 26 are not limited to this. The measurement intervals by the electric power information measurement unit 26 may be other measurement intervals such as intervals of one-half second or three seconds. In the first embodiment, the measurement intervals of the electric power information by the electric power information measurement unit 26 may not be constant intervals, and the measurement intervals by the electric power information measurement unit 26 may differ from the supplement intervals of the electric power information by the supplement unit 46.

The power supply controlling apparatus 100 of the first embodiment restores the plurality of pieces of electric power information and the measurement times stored into the flash ROM 14 to the SDRAM 12 when the main body power supply 30 is turned off and turned on again. Therefore, it is possible to continuously acquire the history of the electric power information concerning the electric power supplied to another apparatus, based on the data stored into the SDRAM 12. Since the access speed to the SDRAM 12 is faster than that to the flash ROM 14, the access speed to the data of the electric power information and the measurement time can be improved. Also, there is a case where data is compressed and stored to memorize more data into the flash ROM 14. In this case, the compressed data needs to be decompressed to acquire the data of the electric power information and so on from the flash ROM 14. Thus, even when the data is compressed and stored into the flash ROM 14, the power supply controlling apparatus 100 can acquire the electric power information stored into the flash ROM 14 by decompressing and restoring the electric power information and the measurement time stored into the flash ROM 14 to the SDRAM 12.

Although the first embodiment has illustrated that the electric power information and the measurement time stored into the SDRAM 12 are transferred and stored into the flash ROM 14 every time the electric power information measurement unit 26 measures the electric power information 300 times, the timing of transferring the data on the electric power information and the measurement time stored into the SDRAM 12 is not limited to this. The timing of transferring the data on the electric power information and the measurement time stored into the SDRAM 12 may be defined by the number of times of measurement by the electric power information measurement unit 26 (e.g. a threshold value of the number of times of measurement such as 100 times or 200 times can be freely set), or may be defined by elapsed time after the measurement of the electric power information by the electric power information measurement unit 26 begins. Also, a user executes given operation, so that the data stored into the SDRAM 12 may be transferred and stored into the flash ROM 14. Thus, the electric power information and the measurement time stored into the SDRAM 12 can be stored into the flash ROM 14 in desired timing.

Although the first embodiment has illustrated that the volatile storage is the SDRAM 12, and the nonvolatile storage is the flash ROM 14, the volatile storage and the nonvolatile storage are not limited to these. The nonvolatile storage which stores the electric power information and the measurement time transferred from the volatile storage may be provided outside the power supply controlling apparatus 100, and may be an external storage device connected to the communication unit 28. The external storage device may be a server, for example.

In the first embodiment, a recording medium on which the software program for realizing the functions of the power supply controlling apparatus 100 is recorded may be supplied to the power supply controlling apparatus 100, and the CPU 10 of the power supply controlling apparatus 100 may read and execute the program recorded on the recording medium. In this manner, the same effects as those of the first embodiment can be achieved. The recording medium for providing the program may be a CD-ROM (Compact Disk Read Memory), a DVD (Digital Versatile Disk), a SD (Secure Digital) card or the like, for example.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:
1. A power supply controlling apparatus comprising:
a first power supply that supplies electric power to a central processing unit in the power supply controlling apparatus and another apparatus other than the power supply controlling apparatus;
a second power supply that supplies electric power to the another apparatus without supplying the electric power to the central processing unit even when the first power supply is turned off;
a measurement portion that measures electric power information concerning electric power supplied to the another apparatus;
a storing control portion that stores the electric power information measured by the measurement portion and measurement time when the electric power information is measured, to a volatile storage, and stores the electric power information and the measurement time stored to the volatile storage, to a nonvolatile storage in desired timing; and
a supplement portion that, when the first power supply is turned off and turned on again the central processing unit compares a time when the first power supply is turned on again with a final measurement time in a plurality of pieces of measurement time stored in the nonvolatile storage and determines the time when the first power supply is turned on again is later than the final measurement time, supplements to the volatile storage electric power information and time concerning electric power assumed to be supplied to the another apparatus between the final measurement time and the time when the first power supply is turned on again.

2. The power supply controlling apparatus according to claim 1, wherein the supplement portion supplements electric power information measured immediately after the first power supply is turned on again, to the voltage storage.

3. The power supply controlling apparatus according to claim 1, wherein the supplement portion supplements electric power information finally measured in a plurality of pieces of electric power information stored to the nonvolatile storage, to the volatile storage.

4. The power supply controlling apparatus according to claim 1, wherein the supplement portion supplements electric power information indicating that the electric power supplied to the another apparatus is "0", to the volatile storage.

5. The power supply controlling apparatus according to claim 1, wherein the supplement portion supplements electric power information calculated from a plurality of pieces of electric power information stored to the nonvolatile storage, to the volatile storage.

6. The power supply controlling apparatus according to claim 5, wherein the supplement portion supplements the electric power information acquired by averaging the plurality of pieces of electric power information stored to the nonvolatile storage, to the volatile storage.

7. The power supply controlling apparatus according to claim 1, wherein a measurement interval of the electric power information by the measurement portion is the same as a supplement interval of the electric power information and the time by the supplement portion.

8. The power supply controlling apparatus according to claim 1, further comprising a restoring portion that restores the electric power information and the measurement time stored to the nonvolatile storage to the volatile storage when the first power supply is turned off and turned on again.

9. The power supply controlling apparatus according to claim 1, wherein the supplement portion supplements electric power information reflecting a variation history of a plurality of pieces of electric power information stored to the nonvolatile storage.

10. A non-transitory computer readable recording medium causing a power supply controlling apparatus to execute a process, the process comprising:
    supplying electric power from a first power supply to a central processing unit in the power supply controlling apparatus and another apparatus other than the power supply controlling apparatus;
    supplying electric power from a second power supply to the another apparatus without supplying the electric power to the central processing unit even when the first power supply is turned off;
    measuring electric power information concerning electric power supplied to the another apparatus;
    storing the measured electric power information and measurement time when the electric power information is measured, to a volatile storage, and storing the electric power information and the measurement time stored to the volatile storage, to a nonvolatile storage in a desired timing; and
    supplementing, when the first power supply is turned off and turned on again the central processing unit compares a time when the first power supply is turned on again with a final measurement time in a plurality of pieces of measurement time stored in the nonvolatile storage and determines the time when the first power supply is turned on again is later than the final measurement time, to the volatile storage electric power information and time concerning electric power assumed to be supplied to the another apparatus between the final measurement time and the time when the first power supply is turned on again.

* * * * *